United States Patent [19]

Luth et al.

[11] Patent Number: 5,248,890
[45] Date of Patent: Sep. 28, 1993

[54] VALANCE SPECIFIC LANTHANIDE DOPED OPTOELECTRONIC METAL FLUORIDE SEMICONDUCTOR DEVICE

[75] Inventors: Hans Luth, Aachen; Harald D. Muller, Hinterzarten; Jurgen Schneider, Kirchzarten, all of Fed. Rep. of Germany; Ralf Strumpler, Baden, Switzerland

[73] Assignee: Forschungszentrum Jülich GmbH, Jülich, Fed. Rep. of Germany

[21] Appl. No.: 711,312

[22] Filed: Jun. 6, 1991

Related U.S. Application Data

[63] Continuation-in-part of Ser. No. 523,803, May 11, 1990, abandoned.

[30] Foreign Application Priority Data

May 13, 1989 [DE] Fed. Rep. of Germany ....... 3915701

[51] Int. Cl.$^5$ .................. H01L 33/00; H01L 27/14; H01L 49/02; H01L 29/167
[52] U.S. Cl. ................. 257/102; 257/103; 257/607; 257/80
[58] Field of Search ............ 357/15, 30 R, 30 B, 357/6, 17, 61, 63; 250/361 R; 428/690, 917; 313/509; 257/102, 103, 432, 607, 614, 80

[56] References Cited

U.S. PATENT DOCUMENTS

| | | | |
|---|---|---|---|
| 4,492,743 | 1/1985 | Howe | 357/15 |
| 4,708,494 | 11/1987 | Kleinerman | 250/361 R |
| 4,967,251 | 10/1990 | Tanaka et al. | 357/30 B |

OTHER PUBLICATIONS

Ennen et al. "1.54-$\mu$m electroluminescence of Er doped Si grown by molecular beam epitaxy" *Appl. Phys. Lett* vol. 46 No. 4 Feb. 15, 1985 pp. 381-383.
Uwai et al. "Er doped InP and GaAs grown by metalorganic CVD" *Appl. Phys. Lett* vol. 51 No. 13, Sep. 28, 1987 pp. 1010-1012.

*Primary Examiner*—Mark V. Prenty
*Attorney, Agent, or Firm*—Herbert Dubno

[57] ABSTRACT

An optoelectronic device, e.g. for integrated circuits, has an Si, II-VI or III/V semiconductor layer and an LaF$_3$ or La$_{1-x}$X$_x$F$_3$ insulating layer which is doped with Nd or Er to generate an optical signal whose wavelength is determined by the 4f ions used. The insulating layer can be grown epitaxially on the semiconductor layer and the lanthanide element ion substituting for a metal ion of the material forming the insulating layer has the same valence as the metal for which it is substituted.

15 Claims, 2 Drawing Sheets

VALANCE SPECIFIC LANTHANIDE DOPED OPTOELECTRONIC METAL FLUORIDE SEMICONDUCTOR DEVICE

CROSS REFERENCE TO RELATED APPLICATION

This application is a continuation-in-part of Ser. No. 07/523,803 filed May 11, 1990 now abandoned.

FIELD OF THE INVENTION

Our present invention relates to an optoelectronic device having an insulator or insulating layer which is doped with a lanthanide to generate an optical signal whose wavelength is determined by the ion of the 4f series of the Periodic Table (lanthanide) which is used.

BACKGROUND OF THE INVENTION

In modern communications and information technology, optoelectronic devices play increasingly important roles. For example, they form interfaces between the communication carriers (optical fibers) and the processing stations which largely use semiconductor electronics.

Optoelectronic devices convert optical signals into electrical signals and, conversely, convert electrical signals to optical signals in the form of photons of light emitted from the component.

While the greater part of microelectronic circuitry to date has been based upon silicon technology, in the field dealing with light/electrical signals, i.e. optoelectronic components, so called III/V or III-V semiconductor elements have been employed for lasers, light emitting diodes (LED) and the like. Group III/V or III-V semiconductors are semiconductors having as one element at least one member of group IIIA of the Periodic Table (e.g. Al, Ga, In, Tl) and as a second element at least one member of group VA of the Periodic Table (e.g. P, As, Sb, Bi).

With respect to state of the art, reference can be made to Optics and Spectroscopy, 26 (1969), page 176 and J. Appl. Phys. 44 (1973), pages 5029-5030. Here a system is described in which a fluoride layer, for example $CaF_2$ and $CdF_2$ is doped with rare-earth elements such as Tb or Gd.

The reason for this is that the important electron transitions between conduction and valence bands, in the case of silicon, by contrast to the transitions in many III/V semiconductors, do not show luminesence.

With respect to state of the art, reference can be made to Optics and Spectroscopy, 26 (1969), page 176 and J. Appl. Phys. 44 (1973), pages 5029-5030. Here a systems is described in which a fluoride layer, for example $CaF_2$ and $CdF_2$ is doped with rare-earth elements such as Tb or Gd.

The rare-earth spectral line associated with a doping with lanthanides, i.e. 4f ions, has light-emitting advantages over the emission line of a III/V semiconductor light-emitting diode or a laser since the core-level emission line of the rear earth is sharper than the valence band generated broader laser line generated by a valence bond transition. Furthermore, as a result of the doping with lanthanides, problems with respect to thermal instabilities are avoided.

The 4f transition is excited in electronic applications by means of cathodo-luminescence, by impact ionization during current flow across two contacts in diode configurations or by light irradiation, for example, by means of a semiconductor laser which has its emission line corresponding to the excitation energy of the intra-f-shell transitions.

The recombination of the electron-hole pairs generated by such excitation in rare-earth ions gives rise to the emission of an energetic, relatively sharp spectral line.

OBJECTS OF THE INVENTION

It is, therefore, an object of the invention to provide an optoelectronic device of the above-described type which is characterized by a high intensity and spectrally sharp emission.

Another object of the invention is to provide an optoelectronic device which avoids the drawbacks of earlier systems.

Yet another object is to extend the principles of the above-identified application.

SUMMARY OF THE INVENTION

These objects and others which will become apparent hereinafter are attained, in accordance with the present invention, in an optoelectronic device for generating optical signals, comprising a semiconducting substrate, an insulator on the substrate, an electrode in contact with the insulator, and a contact connected with the electrode, the insulator being composed of a metallic compound of a metal component comprising at least one metal. According to the invention, the semiconductor substrate is an Si, a III-V or a II-VI semiconductive layer which is bonded to an insulator composed of $LaF_3$ or $La_{1-x}X_xF_3$ where X is Ce, Pr, Pm, Sm, Eu, Gd, Tb, Dy, Sc, Y, Ho, Tm, Yb or Lu, and the insulator is 1 to 10% substituted by Nd or Er, i.e. between 1 and 10 atomic percent of La or X is replaced by Nd or Er. The II-VI semiconductor is a semiconductor having as one element at least one member of group IIB (e.g. Zn, Cd, Hg) of the Periodic Table and as a second element at least one member of group VIA (e.g. S, Se, Te, Po) of the Periodic Table.

In the state of the art with respect to electroluminescence, the trivalent rare earths, such as $Tb^{3+}$, and divalent Wirts crystals, especially $CaF_2$, have the disadvantage, since charge compensation fails, of giving rise to a multiplicity of associated defects. These result in broad, complex luminescence spectra with low intensity related to the spin splitting 4f-level transitions of the rare earths. By contrast, in the present invention, because of the fact that the valence of the lanthanide ions and that of the metal components in the insulator are in agreement, there is a stoichiometric substitution or displacement of the metal ion by the lanthanide ion without complex formation or defect formation. It is self-understood that the valence relationship will impart to the insulator, at least in short range order, a predominantly ionic character which will characterize the chemical bonds and that the local crystallographic or lattice structure formed by the rare-earth ion will correspond to the local crystallographic or lattice structure of the host metal ions since there will not be a great difference between the ionic radii of the various ions.

As a consequence, materials which are characterized by strong covalent bonds between the elements thereof, for example, GaAs will not be deemed to be insulators in the sense of the present invention.

It is not reasonable to distinguish the insulator from a semiconductor in the physical sense. In both cases a so-called "gap" exists between the valence band and the conduction band, the value of which falls off and results in a reduction of the insulating characteristics of the material in favor of its semiconductor characteristics.

Preferably, the insulator is formed as an insulating layer.

According to the invention, the insulator is preferably an epitaxially grown insulator.

It has been found to be especially advantageous to grow the insulator materials as epitaxial layers upon Si(100) or Si(111) layers. In general, therefore, it is advantageous to provide the insulator layer as an epitaxial deposit of a material comprising metal components utilizing rare-earth metals and especially lanthanide, on an Si(100) layer.

According to a feature of the invention, the insulator can be provided between Si layers or III/V semiconductor layers. When at least one of the Si layers or III/V semiconductor layers is epitaxially grown on the insulator, an especially advantageous embodiment is obtained.

According to another feature of the invention the insulator is provided between two Si semiconductor layers or between two III-V semiconductor layers in a multilayer stack in which semiconductor and insulating layers are alternately grown on one another and each have a thickness of substantially one half of a wavelength of light emitted by the optoelectronic component. Advantageously, the insulator and semiconductor layers are epitaxially grown on one another to form the stack. It is possible, utilizing this alternating epitaxial growth, to fabricate superlattices which enable the construction of planar distributed feedback light-emitting diodes or lasers for light emission normal to the layers.

To permit a directed light transmission perpendicular to the layer stack, it is advantageous to make each layer thickness, on interference grounds, respectively $\lambda/2$ where $\lambda$ is the outputted light wavelength. In this case the wavelength should be corrected in the respective medium for the refractive index.

According to a further feature of the invention, the insulator forms a resonator adjacent a light emitting III-V layer grown on an Si, II-VI or III-V substrate. Advantageously the substrate on which the insulator is grown is a III-V substrate selected from the group which consists of GaAs, GaAlAs or InP; the substrate on which the insulator is grown can be a II-VI substrate of CdS. The resonator formed by the insulator adjacent the light-emitting layer serves to stabilize a semiconductor laser in integrated optics, since the insulator layer, for example substituted with Er ions, filters out a small thermally stable spectral line from the relatively broad laser line so that the emission of the resonator/laser combination will be determined by the spectral lines of the lanthanide ions.

BRIEF DESCRIPTION OF THE DRAWINGS

The above and other objects, features and advantages of our invention will become more readily apparent from the following description, reference being made to the accompanying highly diagrammatic drawing in which.

SPECIFIC DESCRIPTION

Figure 1:
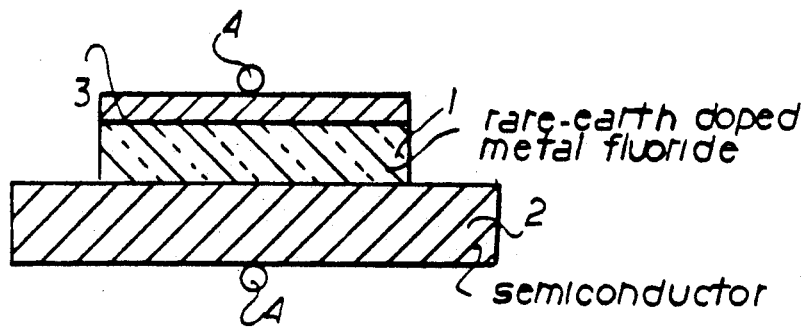
FIG. 1 is a cross sectional view of a silicon based light emitting diode.

The light emitting diode, shown highly diagrammatically in FIG. 1, comprises a insulator layer 1 on an Si wafer 2 upon which the insulator layer 1 has been epitaxially grown. On the insulator layer, in which some of the metal ions have been substituted by Er with corresponding valence, a metal film 3 is deposited to serve as an electrode. A contact 4 can be bonded to the electrode, e.g. by soldering and another contact 4 can be provided on the Si wafer 2 by any conventional means. The insulator layer 1 can be composed of $LaF_3$ or $La_{1-x}X_xF_4$ with 1 to 10 atomic percent of the La or X replaced by Nd or Er, doping elements, X being Ce, Pr, Pm, Sm, Eu, Gd, Tb, Dy, Sc, Y, Ho, Tm, Yd, Lu, or combinations thereof. The doping rare earth, of course, has the same valence as the metal ion of the insulator material which is replaced in the lattice structure of the insulator.

The wafer 2 can have an Si(100) or an Si(111) lattice configuration.

In this application, we have referred to Si(100) and Si(111) to identify the 100 and 111 crystallographic configurations of monocrystalline silicon.

The expressions III/V or III-V are used to refer to binary semiconductor compositions in which III represents an element from group IIIA of the Periodic Table, or more than one such element as the group III component, and V represents an element from group VA of the Periodic Table or a combination of such elements such that the combination of at least one element from group IIIA and at least one element from group VA, forms a semiconductor.

The reference to a II/VI or a II-VI semiconductor, similarly is to a semiconductor composed of at least one element from group IIA and at least one element from group VIA of the Periodic Table which together can form a semiconductor.

The reference to 4f ions, of course, is a reference to the rare-earth elements, otherwise known as the lanthanide series of elements, generally considered to have atomic numbers from 58 through 71 and varying degrees of filling of the 4f shell of the electronic configuration of ions may have valences of $+2$, $+3$ and $+4$, with a $+3$ valence being common to all.

Figure 2:
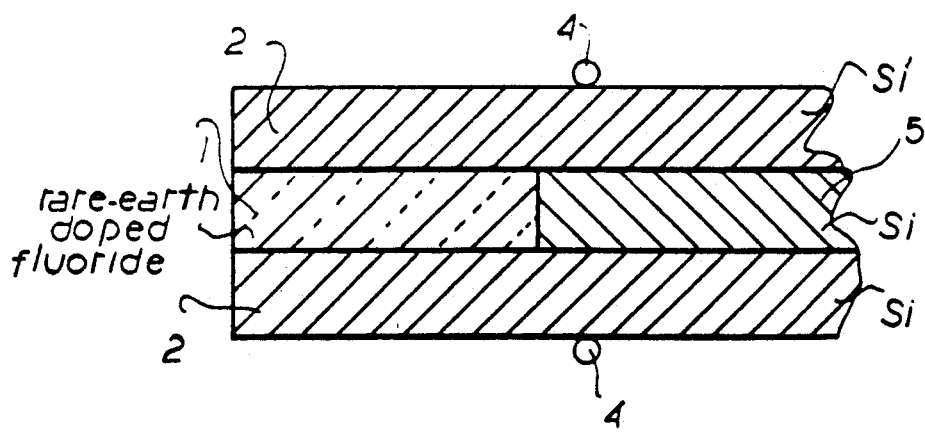
FIG. 2 is a cross sectional view of an integrated diode in which the insulating layer is between two silicon electrodes.

In FIG. 2, the light emitting diode comprises two low ohmic Si layers which can be epitaxially grown and which sandwich between them an epitaxial insulator layer 1 grown on one of the Si layers and adjacent a high ohmic Si layer 5. The contacts or terminals 4 are here provided on the two outer Si layers.

Figure 3:
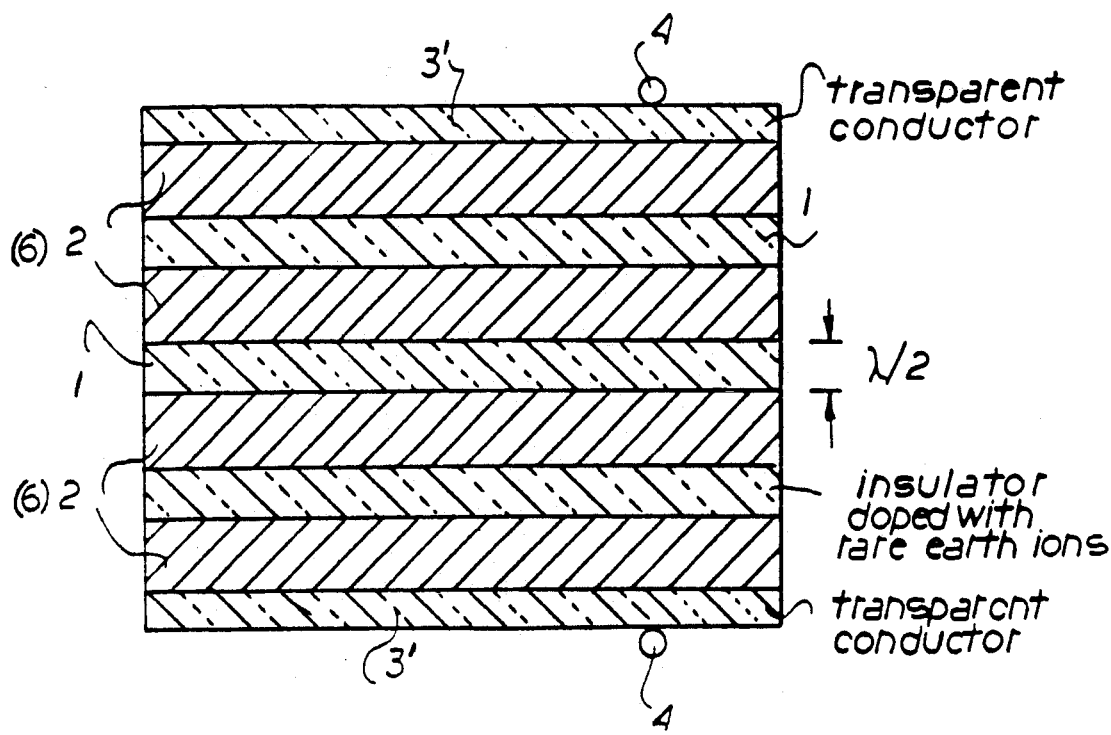
FIG. 3 is a cross sectional view of an optoelectronic device comprised of a plurality of layer pairs.

In the embodiment of FIG. 3, a stack of many layer pairs can be provided. In general that stack may contain between 10 and 100 layer pairs. These layer pairs are formed by epitaxial insulating layers 1 and Si layers 2 grown one upon the other alternatingly. When the insulating layer and SI layers 2 have the construction of FIG. 1 or FIG. 2, the device is a light emitting unit. To form a laser, the Si layers 2 can be replaced by a III/V semiconductive layer 6 as indicated parenthetically. The stack of layers is bounded by transparent electrodes 3 which are provided with the contacts or terminals 4.

Figure 4:
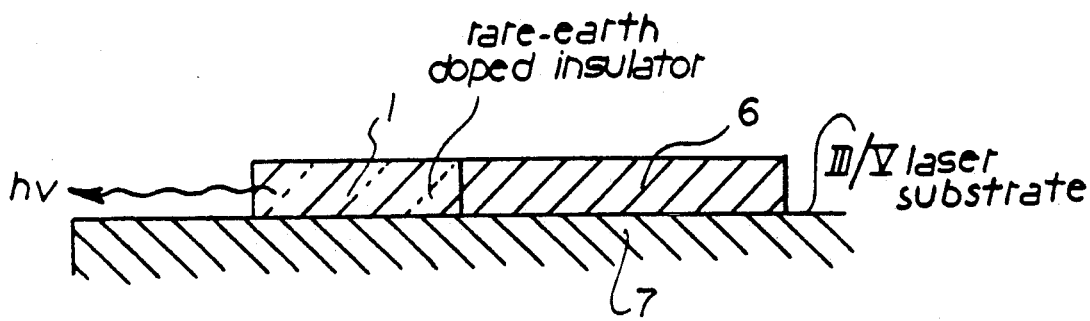
FIG. 4 is a cross sectional view of a component formed with a resonator for stabilizing a semiconductor laser.

FIG. 4 shows a laser construction in which a III/V substrate 7 is provided upon which an insulating layer 4 can be epitaxially grown from either GsAs or InP, substituted with one or more lanthanide series elements of corresponding valence. The insulator layer 1 is disposed adjacent the III/V semiconductor laser layer 6.

The optoelectronic components of the invention can be fabricated in a molecular beam epitaxy apparatus in which either Si or III/V semiconductor layer systems can be deposited in an ultra high vacuum (UHV) environment. For the deposition of the insulator layers the receiving surfaces must be treated to have a "clean" character, i.e. the surface must be free from oxygen or other gases or gaseous adhesions, and, of course, any oxides or compounds. The treatment for cleaning the surfaces can utilize ionic or electron beam exposure. Annealing can then follow.

The insulating layer can be deposited by applying a pulverulent mixture of $LaF_3/Er$ in the desired atomic ratios of the Er and La which is vaporized from a crucible or boat in an appropriate furnace to vapor deposit the insulating layer on the semiconductor. For polycrystalline insulating layers, the treatment of the Si, III/V or II/VI semiconductor surface is less critical.

We claim:

1. A lanthanide-doped optoelectronic device for generating optical signals of a wavelength determined by a 4f lanthanide element of the device, said device comprising a semiconductor layer composed of a semiconductor selected from the group which consists of Si, of III-V semiconductors and of II-VI semiconductors, and an insulator bonded to said semiconductor layer and selected from the group which consists of $LaF_3$ and a lanthanum trifluoride containing an element X selected from the group which consists of Ce, Pr, Pm, Sm, Eu, Gd, Tb, Dy, Sc, Y, Ho, Tm, Yb and Lu, and wherein 1 to 10 atomic percent of the element selected from the group of La and X thereof is substituted by a doping element selected from the group which consists of Nd and Er.

2. The optoelectronic device defined in claim 1 wherein said insulator is formed as a layer on said semiconductor layer.

3. The optoelectronic device defined in claim 1 wherein said insulator is an epitaxial layer.

4. The optoelectronic device defined in claim 1 wherein said insulator is on a layer selected from the group which consists of Si(100) and Si(111) layers.

5. The optoelectronic device defined in claim 1 wherein said insulator is disposed between two Si layers.

6. The optoelectronic device defined in claim 5 wherein at least one of said Si layers is an epitaxial layer on said insulating layer.

7. The optoelectronic device defined in claim 5 wherein said insulator and said Si layers form a multilayer stack in which insulator layers and Si layers are alternately grown on one another and each have a thickness of one-half of a wavelength of light emitted by said device.

8. The optoelectronic device defined in claim 7 wherein said insulator layers and said Si layers are alternating epitaxial layers on one another.

9. The optoelectronic device defined in claim 1 wherein said insulator is disposed between two III-V semiconductor layers.

10. The optoelectronic device defined in claim 9 wherein at least one of said III-V semiconductor layers is an epitaxial layer on said insulating layer.

11. The optoelectronic device defined in claim 10 wherein said insulator and said semiconductor layers form a multilayer stack in which insulator layers and semiconductor layers are alternately grown on one another and each have a thickness of one-half of a wavelength of light emitted by said device.

12. The optoelectronic device defined in claim 11 wherein said insulator layers and said semiconductor layers are alternating epitaxial layers on one another.

13. The optoelectronic device defined in claim 1 wherein the insulator forms a resonator adjacent a light-emitting III-V semiconductor layer on a substrate selected from the group which consists of Si, II-VI and III-V substrates.

14. The optoelectronic device defined in claim 12 wherein said substrate is a III-V substrate selected from the group which consists of GaAs, GaAlAs and InP.

15. The optoelectronic device defined in claim 12 wherein said substrate is composed of CdS.

* * * * *